United States Patent [19]

Iwasaki

[11] Patent Number: 5,865,632
[45] Date of Patent: Feb. 2, 1999

[54] SEMICONDUCTOR PACKAGE SOCKET

[75] Inventor: Hiroshi Iwasaki, Yokohama, Japan

[73] Assignee: Kabushiki Kaisha Toshiba, Kanagawa-ken, Japan

[21] Appl. No.: 870,271

[22] Filed: Jun. 6, 1997

Related U.S. Application Data

[63] Continuation of Ser. No. 396,235, Mar. 1, 1995, abandoned.

[30] Foreign Application Priority Data

Mar. 2, 1994 [JP] Japan ..................................... 6-032295

[51] Int. Cl.⁶ .................................................... G01R 31/02
[52] U.S. Cl. ............................ 439/71; 324/754; 324/761
[58] Field of Search ..................................... 439/700, 824, 439/912.1, 70, 71, 73, 525, 526; 324/158 P, 158 F, 761, 754

[56] References Cited

U.S. PATENT DOCUMENTS

| | | | |
|---|---|---|---|
| 4,352,061 | 9/1982 | Matrone | 324/754 |
| 4,358,175 | 11/1982 | Reid | 439/700 |
| 5,534,787 | 7/1996 | Levy | 324/761 |
| 5,688,127 | 11/1997 | Staab et al. | 439/71 |

*Primary Examiner*—Gary F. Paumen
*Attorney, Agent, or Firm*—Finnegan, Henderson, Farabow, Garrett & Dunner, L.L.P.

[57] ABSTRACT

A semiconductor package socket comprises an insulating support substrate, pin contacts arranged in a constant-pitch lattice-array and which are attached in a manner that permits advance or retreat in a direction which is almost perpendicular to a main surface of the support substrate, a pin contact movement driving mechanism which advances or retreats the pin contacts en bloc, and a guide frame which has spaces to accommodate said pin contacts, which is freely detachable and which can cover areas other than those required by the pin contacts.

10 Claims, 5 Drawing Sheets

SEMICONDUCTOR PACKAGE SOCKET

This is a continuation of application Ser. No. 08/396,235, filed Mar. 1, 1995, now abandoned.

BACKGROUND OF THE INVENTION

1. Field of the Invention

This invention relates to a semiconductor package socket and, in particular, to a socket suitable for a semiconductor package wherein a semiconductor chip is mounted on a main surface of a board equipped with a wiring circuit that includes portions to be connected, and wherein flat external connector terminals for connecting to the input/output part of the semiconductor chip are arranged in a constant-pitch lattice-array and are derived and exposed on the back of the board.

2. Description of the Related Art

For example, the structure of a memory card is restricted by such factors as its shape, size, and thickness. Thus, compact mounting of a semiconductor chip that provides memory and control functions is called for. Further, when packaging the semiconductor chip, it is desirable, as much as possible, for the package to be as thin or as compact as the semiconductor chip itself.

Some well-known methods used for compactly mounting the semiconductor chip are the TAB (Tape Automated Bonding) method, the flip chip mounting method and the COB (Chip on Board) method. A typical example of the compact package is given in FIG. 1 which shows a cross-sectional view of the principal structure of the semiconductor package comprising compact circuit board 1 on a main surface of which a semiconductor chip 2 with a memory function, and other electrical parts, are mounted; flat external connector terminals 4 derived from the other main surface of circuit board 1 via through-hole 3, and mold resin layer 5 which coats and seals the mounting region of said semiconductor chip 2. Reference numeral 6 in FIG. 1 represents a bonding wire. The semiconductor package wherein the external connector terminals are derived and exposed on the back (bottom) has the following advantages that make it attractive from the practical point of view:

(a) Face-down mounting is materially possible;
(b) When the semiconductor chip itself is mounted face down, it may be made more compact by eliminating some of the resin mold; and
(c) Compared to that of the semiconductor chip itself, electrical testing of individual products is easier.

However, while the external dimensions of the compact semiconductor package would differ according to the type or capacity of mounted semiconductor chip 2, the number and array form of external connector terminals 4 derived and exposed on the back would also differ. Therefore, when electrically testing and evaluating said compact package, is necessary to prepare dedicated semiconductor package sockets having pin contacts adapted to the number and array form of said external connector terminals 4. Thus, depending on the number and array form of the external connector terminals, dedicated sockets must be prepared beforehand in order to perform electrical testing and evaluation. This means that a large number of dedicated sockets for certain numbers and array forms of the external connector terminal of the semiconductor package is required. However, if the socket for testing is adaptable to many types of semiconductor packages, it is practically difficult to set the size of the compact semiconductor package close to that of the semiconductor chip.

Further, if external connector terminals 4 derived and exposed on the back of said compact semiconductor package are arranged in a constant-pitch lattice-array, the connecting terminals on the surface of the mounted wiring board can be standardized. Standardization of said connecting terminals then lead to the standardization of circuit design for mounted wiring boards, thus making it possible to expand the versatility of mounted wiring boards.

An object of the present invention is to provide a semiconductor package socket suitable for electrical testing of compact semiconductor packages having external connector terminals arranged in a constant-pitch lattice-array.

A further object of this invention is to provide a semiconductor package socket which is highly reliable for electrical testing and evaluation of compact semiconductor packages having external connector terminals arranged in a constant-pitch lattice-array.

A still further object of the present invention is to provide allow-cost semiconductor package socket through standardization.

A yet still further object of the present invention is to provide a semiconductor package socket which may be used regardless of the type of the compact semiconductor package wherein external connector terminals are arranged in a constant-pitch lattice-array.

Yet another object of the present invention is to provide a semiconductor package socket wherein it is possible to standardize the circuit design of the mounted wiring board and expand the versatility of the mounted wiring board.

SUMMARY OF THE INVENTION

The semiconductor package socket of the present invention comprises an insulating support substrate, pin contacts built into the support substrate and which are arranged in a constant-pitch lattice-array and are attached in a manner that allows advance or retreat in a direction almost perpendicular to a main surface of the support substrate, a pin contact movement driving mechanism which advances or retreats the pin contacts en bloc, and a freely detachable guide frame having empty spaces for accommodating the pin contacts and covering areas other than those required by the pin contacts.

The semiconductor package socket of the present invention is intended for a semiconductor package having a certain structure. Designed to be compact and low cost by mounting semiconductor chip and other electrical parts on a main surface (one face) of a resin or ceramic board, the intended semiconductor package also has external connector terminals arranged in a constant-pitch lattice-array that permits easy standardization and which are derived from the other main surface (i.e., surface where nothing is mounted) of the board. Further, by eliminating an upper surface mold resin layer of the mounted semiconductor chip and other electrical parts, the semiconductor package can be made more compact by as much. Yet further, the cost involved in preparing individual sockets for each type of semiconductor package is reduced because regardless of the number and array region of the external connector terminals of semiconductor packages wherein external connector terminals are arranged in a constant-pitch lattice-array, the socket can be generally adapted and attached.

It is also advisable for the tips of the pin contacts used in the semiconductor package socket of the present invention to be slightly splayed to increase the contact surface with the external connector terminals of the semiconductor package. Further, the advance or retreat of pin contacts almost perpendicular to the main surface of the insulating support substrate may be done as follows. For example, when springs are fitted to some or all of the pin contacts, the support substrate permits advance or retreat due to the weight of the semiconductor placed on the support substrate (i.e., addition of pressure), or the advance or retreat of the pin contacts themselves accomplish the task.

The surface of one side of the semiconductor package socket of the present invention is equipped with pin contacts arranged in a constant-pitch lattice-array. In particular, the semiconductor package socket utilizes pin contacts that are likewise arranged in a constant-pitch lattice-array for adapting the constant-pitch lattice-arrayed external connector terminals of the semiconductor package to be attached to the socket for testing an evaluation. The pin contacts are attached in a manner that permits advance or retreat. Further, a guide frame can be installed onto the pin contacts of this semiconductor package socket. In effect, depending on the selected guide frame, pin contacts in any region can be exposed to serve as contact terminals. Only the region partitioned by the selected guide frame functions as the actual semiconductor socket. This means that, by selecting and using a guide frame adaptable to the shape of the semiconductor package, the socket may be commonly used regardless of the type of semiconductor package.

The foregoing and other objects, features, and advantages of this invention will become apparent from the following detailed description of preferred embodiments of this invention, as illustrated in the accompanying drawings.

DESCRIPTION OF THE PREFERRED EMBODIMENTS

Preferred embodiments of the present invention shown in FIGS. 2, 3, 4, 5, and 6 are described in detail hereinafter.

Figure 1:
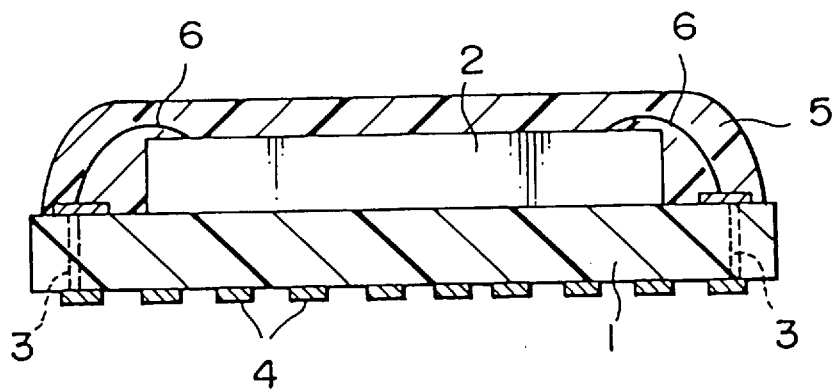
FIG. 1 is a cross section showing an example of the principal structure of a conventional semiconductor package.
Figure 2:
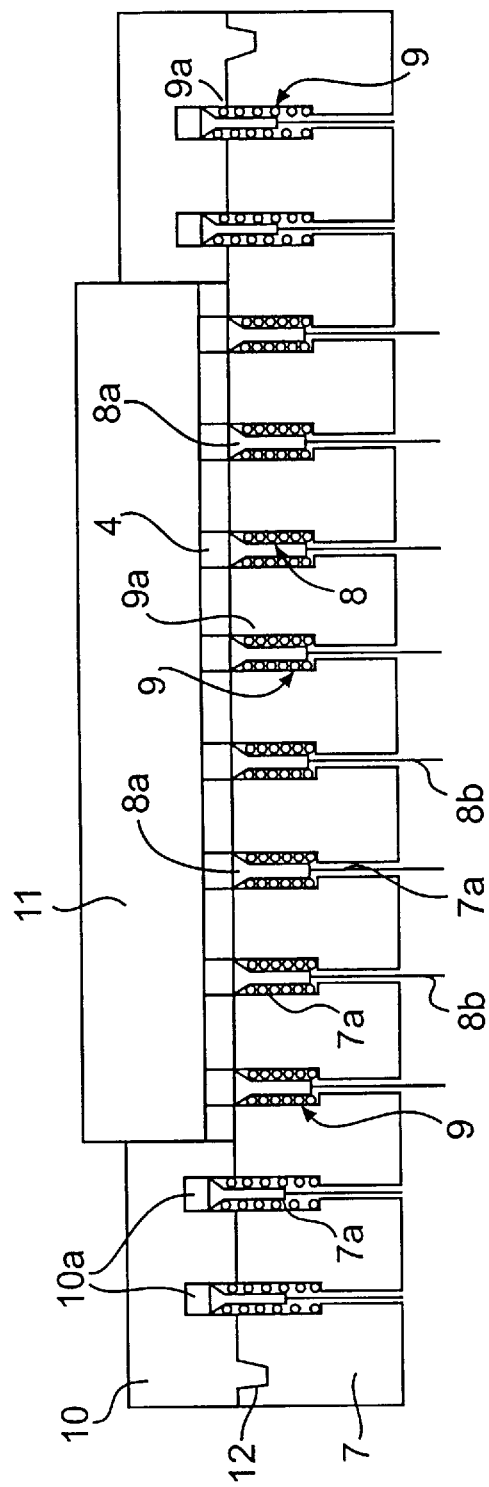
FIG. 2 is a cross section showing an example of the principal structure of the semiconductor package socket of the present invention.
Figure 3:
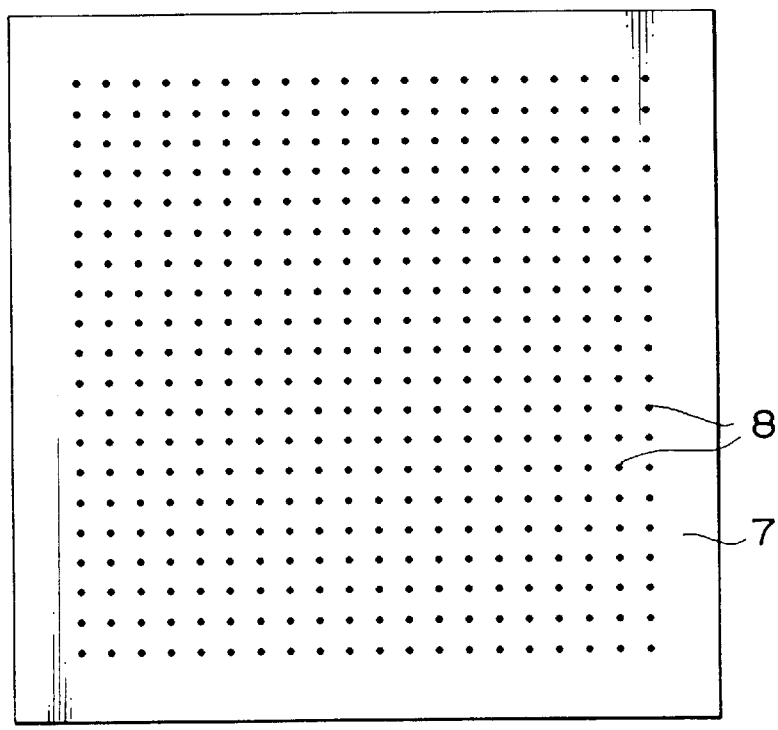
FIG. 3 is a partial plan view of an example of the principal structure of the semiconductor package socket of the present invention.

FIG. 2 is a cross section and FIG. 3 is a plan view of a sample principal structure of the semiconductor package socket of the present invention. In both FIGS. 2 and 3, reference numeral 7 designates an insulating support substrate (ceramic or synthetic resin type); reference numeral 8 generally designates contact pins built into the support substrate 7 and arranged in a constant-pitch (e.g., 1 mm) lattice-array, which contact pins are attached in a manner that permits advance or retreat in a direction almost perpendicular to a main surface of support substrate 7; reference numeral 9 generally designates a contact pin movement driving mechanism which advances or retreats the contact pins 8. Further, in this structural example, contact pin movement driving mechanism 9 is comprised as follows. In said support substrate 7, there is a stepped hole 7a which penetrates the thickness of the constant-pitch lattice-array. Spring 9a is fixed to the larger diameter of this stepped hole 7a and fitted onto pin contact 8a to attach and position it. Lead 8b which is connected to pin contact 8a, moves slidingly in the smaller diameter of stepped hole 7a and makes advance or retreat possible. In short, when pressure is applied over the surface of support substrate 7, those pin contacts 8a subjected to the pressure are depressed against the respective springs 9a, whereas pin contacts 8a not subject to the pressure remain elevated by the springs 8a. The tip of pin contact 8a, i.e., the surface which comes in contact with the flat external connector terminal 4 of the semiconductor package is splayed, assuring a highly reliable electrical connection.

Further, a guide frame 10 has plural empty spaces 10a which can accommodate pin contacts 8a in an elevated position; the guide frame 10 is freely detachable and can cover areas other than those where pin contact with the flat external connector terminals 4 of the semiconductor chip 2 is required. Thus, the guide frame 10 provides a required socket cover which partitions unnecessary area from a prescribed necessary region and exposes pin contacts 8a in the prescribed region where contact is required by the pin contacts 8a. The locking and unification of support substrate 7 and guide frame 10 are accomplished by a locking fragment 12.

Figure 4:
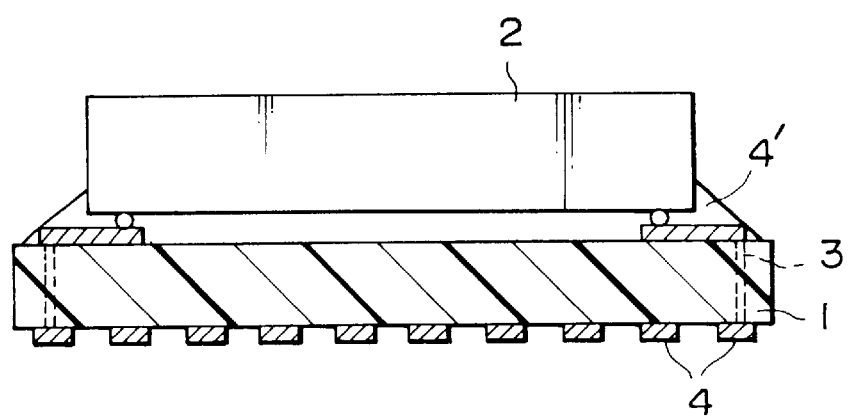
FIG. 4 is a cross section showing another example of the principal structure of the semiconductor package to be attached to the semiconductor package socket of the present invention.
Figure 5:
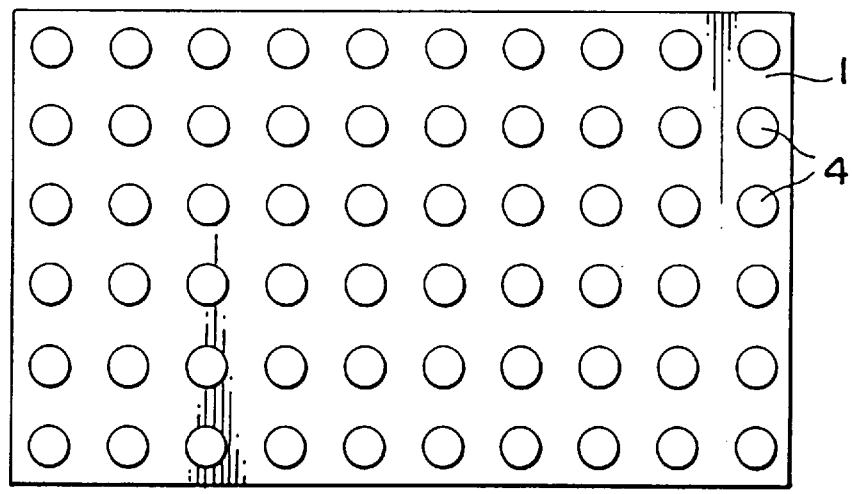
FIG. 5 is a bottom view (back view) of another example of the principal structure of the semiconductor to be attached to the semiconductor package socket of the present invention.

Further, FIG. 4 is a cross section and FIG. 5 is a plan view of a semiconductor package showing the array condition of the external connector terminals. In FIGS. 4 and 5, reference numeral 1 represents a circuit board 10 mm long and 6 mm wide, reference numeral 2 represents a semiconductor chip mounted on a main surface of said circuit board, and reference numeral 4 represents a flat external connector terminal arranged in a constant-pitch (1 mm) lattice-array, has a diameter of 0.5 mm and are derived from the other main surface of circuit board 1 via through-hole 3 of said circuit board 1. The gap between the surface of circuit board 1 and the bottom surface of mounted semiconductor chip 2 is filled with resin layer 4' and molded to reinforce the structure by its binding and unifying effect.

An example of a use of said semiconductor package socket which is adapted to semiconductor packages having the above-described structure is explained below.

Figure 6:
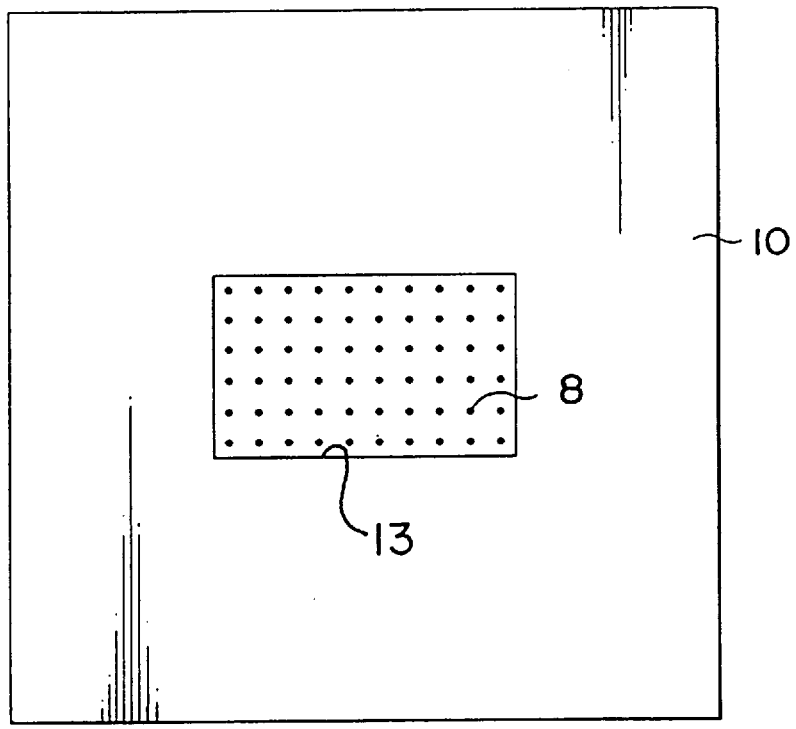
FIG. 6 is a plan view of the principal structure showing a typical condition wherein the semiconductor package has been attached to the semiconductor package socket of the present invention.

FIG. 2 shows a typical condition wherein the required guide frame 10 is attached and positioned in relation to said semiconductor package socket 7 and the semiconductor package 11 is attached to said semiconductor package socket 7. FIG. 6 is a plan view of the semiconductor package socket into which said guide frame 10 is installed. The expanded area 13 is a space for the semicondutor package 11 shown in FIG. 6. As can be seen from FIGS. 2 & 6, the above-mentioned semiconductor package socket 7 adapts to the shape of any semiconductor package smaller than the semiconductor package socket 7 and by combining with the required guide frame 10, any desired socket may be selected and set. In particular, if it were a semiconductor package where external connector terminals are arranged at a constant-pitch and in a lattice-array, regardless of the shape of that semiconductor package and the number or location of external connector terminals 4, it is possible to compose the required socket and attain the required electrical connection by simply selecting guide frame 10. Note that reference numeral 12 in FIG. 2 represents the locking fragment that locks and unifies support substrate 7 and guide frame 10.

From the above description it will be apparent that there is thus provided a device of the character described possessing the particular features of advantage before enumerated as desirable, but which obviously is susceptible to modifications such as in its form, method, mechanization, operation, detailed construction, and arrangements of parts. For instance, the structural example of the movement driving mechanism that allows the advance or retreat of pin contacts 8a utilizes the force and rebounding action of spring 9a. However, it is also possible to employ, say, a system whereby a lid is installed such that the contacts react (i.e., move) to its opening and closing.

As has been explained above, the semiconductor package socket of the present invention has pin contacts arranged in a constant-pitch lattice-array. Thus, in relation to the semiconductor package having external connector terminals arranged in a constant-pitch lattice-array, and in combination with the selected guide frame, the socket works as a contact terminal by exposing pin contacts in any region. In particular, by selecting the guide frame that adapts to the form of the external connector terminals, it functions as a socket within the partitioned region only; as such, it may be used anytime, regardless of the type, shape, size, etc., of the semiconductor package which in turn leads to many advantages in terms of storage/control and cost.

While in order to comply with the statute, the invention has been described in language more or less specific as to structural features shown, but the means, method and construction herein disclosed comprise the preferred form of several modes of putting the invention into effect and the invention is therefore claimed in any of its forms or modifications within the legitimate and valid scope of the appended claims.

What is claimed is:

1. A semiconductor package socket suitable for receiving semiconductor packages varying in size and having flat exterior connector terminals, comprising:

an insulating support substrate having a main surface including first and second regions, a plurality of pin contacts positioned therein, said pin contacts being arranged in a constant-pitch lattice-array throughout the first and second regions and attached so as to allow advance or retreat in a direction substantially perpendicular to the main surface of the support substrate, and a pin contact movement driving mechanism which advances or allows retreat of said plurality of pin contacts; and a guide frame for covering the second region and having a plurality of spaces opposite to said pin contacts in the second region to accommodate said pin contacts, wherein said pin contacts in the second region advance into the spaces when said guide frame is pressed onto the main surface of the support substrate, and said pin contacts in the first region retreat under the flat external connector terminals when the semiconductor package is pressed onto the main surface of the support substrate, said guide frame being freely detachable from the support substrate.

2. A semiconductor package socket as set forth in claim 1, wherein the frame guide has an internal form of substantially the same shape as the semiconductor package to be attached.

3. A semiconductor package socket as set forth in claim 1, wherein the support substrate and the guide frame are detachable by a locking and unlocking mechanism mating a projection on the guide frame and a recess in the support substrate.

4. A semiconductor package socket as set forth in claim 1, wherein the pin contacts are attached to stepped holes extending perpendicular to the main surface of the support substrate, and wherein the pin contact movement driving mechanism includes springs fixed to and fitted into the larger diameter of said stepped hole.

5. A semiconductor package socket as set forth in claim 1, claim 2, claim 3 or claim 4, wherein the tips of the pin contacts are slightly splayed.

6. A semiconductor package socket as set forth in claim 1, wherein said semiconductor package comprises a circuit board, a semiconductor chip mounted face-down on a main surface of the circuit board, the flat external connector terminals being formed on a surface opposite from the main surface and connecting with the semiconductor chip via through-holes of the circuit board, the flat external terminals being arranged in a constant pitch lattice array.

7. A semiconductor package socket as set forth in claim 6, wherein a gap between the main surface of the circuit board and a bottom surface of the semiconductor chip is filled with a resin layer.

8. An assembly of a semiconductor package and a standardized semiconductor package socket for attaching the semiconductor package, comprising:

a support substrate having a plurality of pin contacts positioned in the support substrate, the pin contacts being arranged in a constant-pitch lattice-array and having means for advancing and retreating in a direction substantially perpendicular to a main surface of the support substrate, wherein said support substrate has a first region to attach the semiconductor package and a second region, a guide frame for partitioning the first region, the guide frame being disposed on the second region of the support substrate and having a plurality of spaces to accommodate and cover the pin contacts in the second region, and the semiconductor package being disposed on the first region of the support substrate and comprising a circuit board, a semiconductor chip mounted face down on a first main surface of the circuit board, and flat external connector terminals electrically connected to the semiconductor chip and arranged on a second main surface of the circuit board in a lattice array with the same pitch as that of the pin contacts, wherein each of the pin contacts in the first region contacts with each of the flat external connector terminals in a retreated state by pressing the flat external connector terminals of the semiconductor package onto the pin contacts of the support substrate.

9. An assembly as set forth in claim 8, wherein the guide frame has an internal form of substantially the same shape and form as the semiconductor package.

10. An assembly as set forth in claim 8, wherein the support substrate and the guide frame are detachable by a locking and unlocking mechanism mating a projection on the guide frame and a recess in the support substrate.

* * * * *